(12) United States Patent
Wang

(10) Patent No.: US 7,423,460 B2
(45) Date of Patent: Sep. 9, 2008

(54) SINE WAVE SHAPER WITH VERY LOW TOTAL HARMONIC DISTORTION

(75) Inventor: Zhenhua Wang, Zürich (CH)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/548,849

(22) PCT Filed: Mar. 9, 2004

(86) PCT No.: PCT/IB2004/050214

§ 371 (c)(1),
(2), (4) Date: Sep. 9, 2005

(87) PCT Pub. No.: WO2004/082130

PCT Pub. Date: Sep. 23, 2004

(65) Prior Publication Data

US 2006/0186967 A1    Aug. 24, 2006

(30) Foreign Application Priority Data

Mar. 14, 2003 (EP) ................................. 03100654

(51) Int. Cl.
*H03B 28/00* (2006.01)
(52) U.S. Cl. ........................ 327/129; 327/100
(58) Field of Classification Search .................. 327/129
See application file for complete search history.

(56) References Cited

U.S. PATENT DOCUMENTS

| 4,395,642 A * | 7/1983 | Traub | 327/129 |
| 4,451,801 A * | 5/1984 | Monticelli | 330/278 |
| 6,833,740 B2 * | 12/2004 | Grillo | 327/129 |

* cited by examiner

*Primary Examiner*—Kenneth B. Wells

(57) ABSTRACT

Apparatus (20) for generating a sine shaped output signal at an output (Sn, Sp). The apparatus (20) comprises a first transistors (M1) and a second transistor (M2) being arranged as differential pair (22). The differential pair (22) has two input nodes (Tp, Tn) allowing a triangular input signal ($V_{in}(t)$) with a given amplitude (A) to be applied between a gate (Tp) of the first transistor (M1) and a gate (Tn) of the second transistor (M2). The differential pair (22) further comprises a node (X) where a source of the first transistor (M1) and a source of the second transistor (M2) is connected. The sine wave shaped signal is provided between a drain (Sp) of the first transistor (M1) and a drain (Sn) of the second transistor (M2). A current mirror (21) is employed for feeding a predefined tail current ($I_{ss}$) into/out of the node (X) of said differential pair (22). The differential pair (22) allows the first transistor (M1) and the second transistor (M2) to be operated in the saturation region such that the sine wave shaped output signal ($I_o$; $V_{out}$) is a nonlinear function of the triangular input signal ($V_{in}(t)$).

12 Claims, 4 Drawing Sheets

SINE WAVE SHAPER WITH VERY LOW TOTAL HARMONIC DISTORTION

The present invention concerns apparatus and integrated circuits for generating a sine wave.

The sine wave is one of the most important and fundamental waveforms because it finds extensive use as test, reference, and carrier signal, etc., and because any other waveform can be expressed as a Fourier combination of basic sine waves. Especially in the fields of telecommunications sine waves are important. In spite of its simplicity, the generation of a sine wave can be a very challenging task, especially when frequency stability, spectral purity, circuit complexity, power and area are concerned.

A variety of circuits and techniques have been developed for the generation of sine waves, such as Wien-bridge oscillators, which use operational amplifiers, resistors and capacitors. Due to the process spread, the oscillating frequency is inaccurate and the application is very limited. Because a very accurate clock signal, which is generated with a quartz, is already available in many integrated circuits, the conversion of a square wave signal into a sine wave is more attractive. One example is the so-called breakpoint technique using piecewise linear approximation. By progressively increasing the amount of loading on the input source, a triangular wave can be converted to a sine wave. The drawbacks are high complexity, high cost, and lack of accuracy. Besides, it does not provide a differential output signal.

In spite of its simplicity, the generation of a sine wave is a very challenging task, as outlined above.

It is a disadvantage of known solutions that they either occupy quite some real estate on an integrated circuit chip, or that the quality of the sine wave is not sufficient for many of today's applications.

It is thus an objective of the present invention to provide a scheme for generating a high quality sine wave.

Accordingly, it is an object of the invention to provide an integrated circuit solution capable of generating a high quality sine wave.

An apparatus in accordance with the present invention is claimed in claim 1. Various advantageous embodiments are claimed in claims 2 through 13.

Immediate benefits of this invention are improved quality and competitiveness.

Other advantages of the present invention are addressed in connection with the detailed embodiments.

For a more complete description of the present invention and for further objects and advantages thereof, reference is made to the following description, taken in conjunction with the accompanying drawings, in which.

The present invention is based on the following principle. The sine wave is certainly one of the most fundamental waveforms, especially in the fields of telecommunications. In spite of its simplicity, its generation can be a very challenging task. It is efficient and convenient to pass a triangular wave through a nonlinear wave-shaping circuit to round off the tips of the triangular wave and to approximate a sinusoidal profile.

According to the present invention, MOS-based sine wave shaper is proposed. Before addressing implementations and embodiments, the theory of the inventive sine wave shaping is presented in detail.

Figure 1:
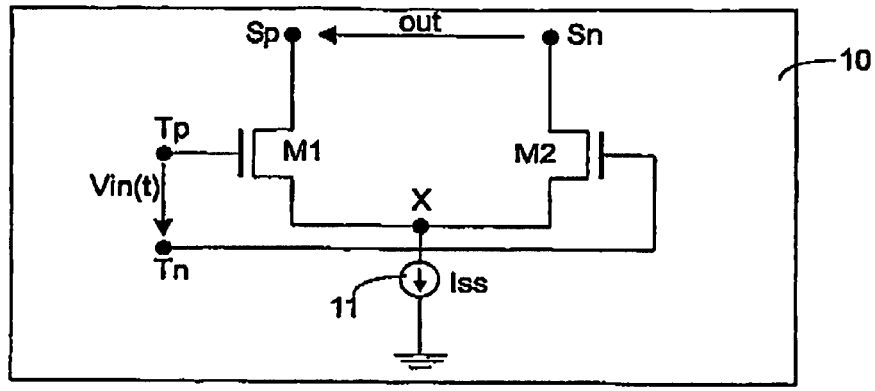
FIG. 1 shows a known differential transistor pair.

A circuit with a MOS differential pair 10 is illustrated in FIG. 1. The circuit comprises a first transistors M1 and a second transistor M2 being arranged as differential pair. This differential pair has two input nodes Tp and Tn. A triangular input signal Vin(t) with a predefined amplitude A is applied between these two input nodes Tp and Tn. The first node Tp is connected to the gate of the first transistor M1 and the second node Tn is connected to the gate of the second transistor M2. The differential pair has a node X where the source of the first transistor M1 and the source of the second transistor M2 are connected. A current mirror 11 is provided for feeding a predefined tail current $I_{ss}$ into/out of the node X of said differential pair. A sine wave shaped current signal $Io = I_1 - I_2$ is provided between the drain Sp of the first transistor M1 and the drain Sn of the second transistor M2. The transistors M1 and M2 are operated in the saturation region such that the sine wave shaped output signal Io is a nonlinear function of the triangular input signal Vin(t).

MOS (metal oxide semiconductor) transistors operating in the saturation region obey well-known square-law characteristics. For the MOS differential pair 10 of FIG. 1, the output current $I_o$ is a nonlinear function of the input signal $V_{in}$, expressed by equation (1)

$$I_0 = I_1 - I_2 = \frac{K}{2} V_{in} \sqrt{\wp} \sqrt{1 - \frac{V_{in}^2}{\wp}} \quad (1)$$

with $\wp = 4I_{ss}/K$ (2)

where $K = \mu_o C_{ox} W/L$ is the transconductance constant, $\mu_o$ is the mobility of carriers, $C_{ox}$ is the gate capacitance per unit area of the transistors M1 and M2, W is the channel width of the transistors M1 and M2, L the channel length of the transistors M1 and M2, and $I_{ss}$ is the tail current, which is normally a DC current. Therefore, $\wp$ is also a constant. One can show that if one chooses $\wp = 3$, or $$I_{SS} = \frac{3}{4} K \quad (3)$$

the equation (1) can be rewritten as:

$$I_0 = \frac{K}{2}\sqrt{3}\left(V_{in} - \frac{V_{in}^3}{6} + \frac{V_{in}^5}{24} - \frac{V_{in}^7}{48} + \ldots\right) \quad (4)$$

On the other hand, a sine function sin x can also be expressed in the series:

$$\sin x = \sum_{w=0}^{\infty} \frac{(-1)^w}{(2w+1)!} x^{2w+1} = \left(x - \frac{x^3}{6} + \frac{x^5}{120} - \frac{x^7}{5040} + \ldots\right) \quad (5)$$

Figure 2:
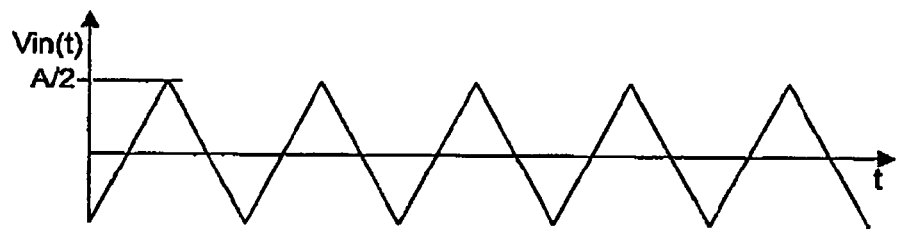
FIG. 2 is a diagram of a triangular shaped wave.

By comparing both equations (4) and (5) term by term, it can be concluded that except for a scale factor, both equations can be considered being very close. Indeed, the difference only occurs from the $5^{th}$ order onwards. This result suggests that a sinusoidal signal might be generated approximately with a MOS differential pair, when a triangular input signal $V_{in}(t)$, as depicted in FIG. 2, is applied and the condition given in equation (3) is met. A triangular wave contains only odd harmonics, and the amplitude of the ith harmonic relative to that of the fundamental is simply $1/i^2$. Therefore, the amplitude of the $3^{rd}$ harmonic is 25/9 times as large as that of the $5^{th}$ harmonic. With the proposed shaping, it is now possible to generate a sine wave whose amplitude of the $3^{rd}$ harmonic is lower than that of its $5^{th}$ harmonic, by very simple means. This feature is very desirable in many applications including telecommunication. Note that the error $\epsilon$ of the shaping according to the invention is given simply by the difference between the equations (4) and (5). The difference can be expressed as follows:

$$\varepsilon = \left( \frac{1}{30} V_{in}^5 - \frac{13}{630} V_{in}^7 + \ldots \right) \quad (6)$$

As mentioned above, there is no error $\epsilon$ at all with the 3rd harmonic and errors only occur starting with the 5th harmonic.

Another parameter that affects the shaping, as suggested by the above equation, is the amplitude A of the triangular input signal $V_{in}(t)$. Neither smaller nor larger input amplitudes A would result in the best performance and the lowest total harmonic distortion (THD). Neglecting terms higher than 7th-order, one can demonstrate that the shaping error a becomes zero if the amplitude of the triangular input signal $V_{in}(t)$ is chosen to be $$V_{in} = 1.271 \, V \quad (7)$$

Figure 3:
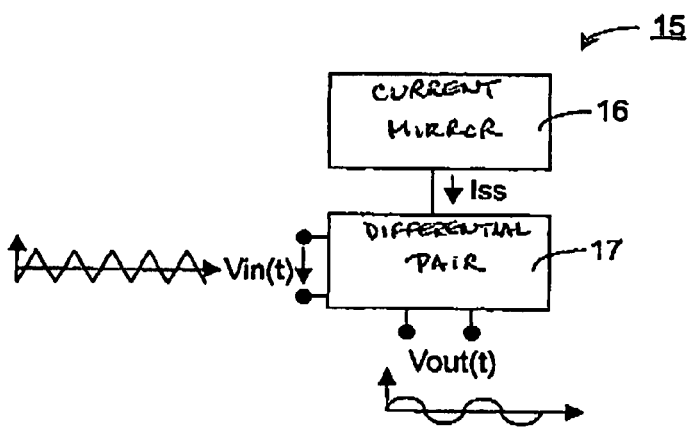
FIG. 3 is a schematic block diagram of a first embodiment, according to the present invention.

A schematic block diagram of a sine wave shaper 15, according to the present invention, is depicted in FIG. 3. The sine wave shaper 15 comprises a current mirror 16 and a differential transistor pair 17. The current mirror 16 provides a tail current $I_{ss}$ to the differential transistor pair 17. According to the present invention, the transistors of the differential transistor pair 17 are operated in the saturation region to shape an input triangular wave to a sine wave Vout(t). This sine wave shaped output signal Vout(t) is a nonlinear function of the triangular input signal Vin(t).

Figure 4:
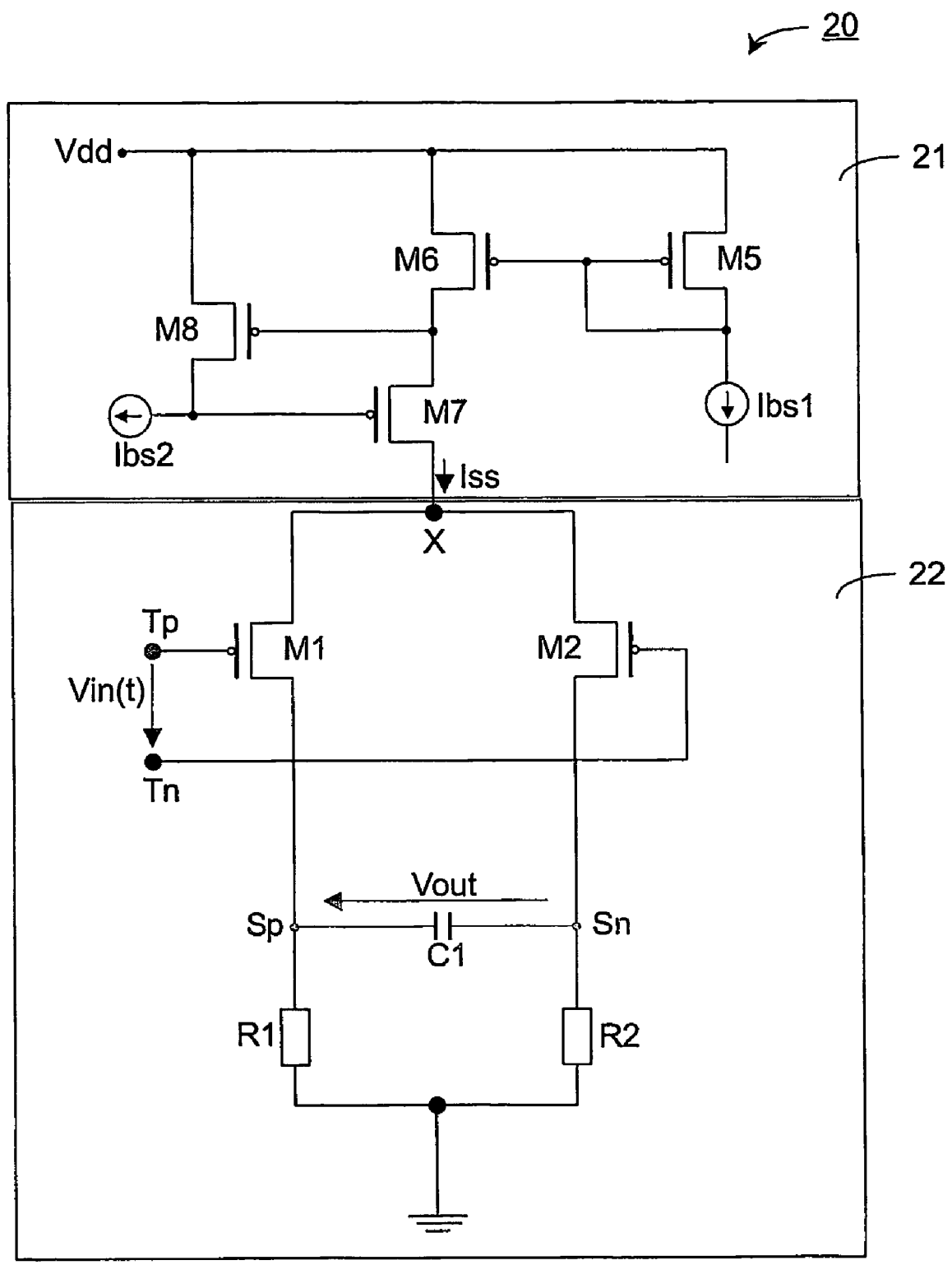
FIG. 4 is a schematic block diagram of a second embodiment, according to the present invention.

One possible MOS implementation is addressed in connection with FIG. 4. After establishing the theory for the sine wave shaping, a MOS embodiment 20, according to the present invention, is derived. FIG. 4 shows a fully-differential MOS embodiment 20, where the MOS transistors M1 and M2 form a matched differential pair. The MOS embodiment 20 comprises a first transistors M1 and a second transistor M2 being arranged as fully-differential pair. This differential pair has two input nodes Tp and Tn. A triangular input signal Vin(t) with a given amplitude A is applied between these two input nodes Tp and Tn. The first node Tp is connected to the gate of the first transistor M1 and the second node Tn is connected to the gate of the second transistor M2. The differential pair has a node X where the source of the first transistor M1 and the source of the second transistor M2 are connected. A current mirror 21 is provided for feeding a predefined tail current $I_{ss}$ into the node X of said differential pair. A sine wave shaped signal Io is provided between the drain Sp of the first transistor M1 and the drain Sn of the second transistor M2. The transistors M1 and M2 are operated in the saturation region to provide the sine wave shaped output signal Io. The resistors R1 and R2 serve as loads.

For better performance, the tail current $I_{ss}$, given by the equation (3), may be provided by a regulated current mirror 21. Details of a regulated current mirror 21 are described in an article by E. Säckinger and W. Guggenbühl: "A high-swing, high-impedance cascode circuit", IEEE Solid-State Circuits, Vol. 25, No. 1, pp. 289-298, 1990. Such a regulated current mirror 21 comprises the four CMOS transistors M5 to M8, and two bias current sources Ibs1 and Ibs2. Without the transistors M7 and M8, the regulated current mirror 21 would become a simple current mirror. The sinusoidal output Vout is taken from the output terminals Sp and Sn, as illustrated in FIG. 4. By adding an optional small capacitor C1, the high-order harmonics can be further suppressed and the THD improved.

In FIG. 4, the output current $I_0$, described by the equation (4), is converted into a output voltage Vout by the load resistors R1 and R2 (with R1=R2).

Figure 5:
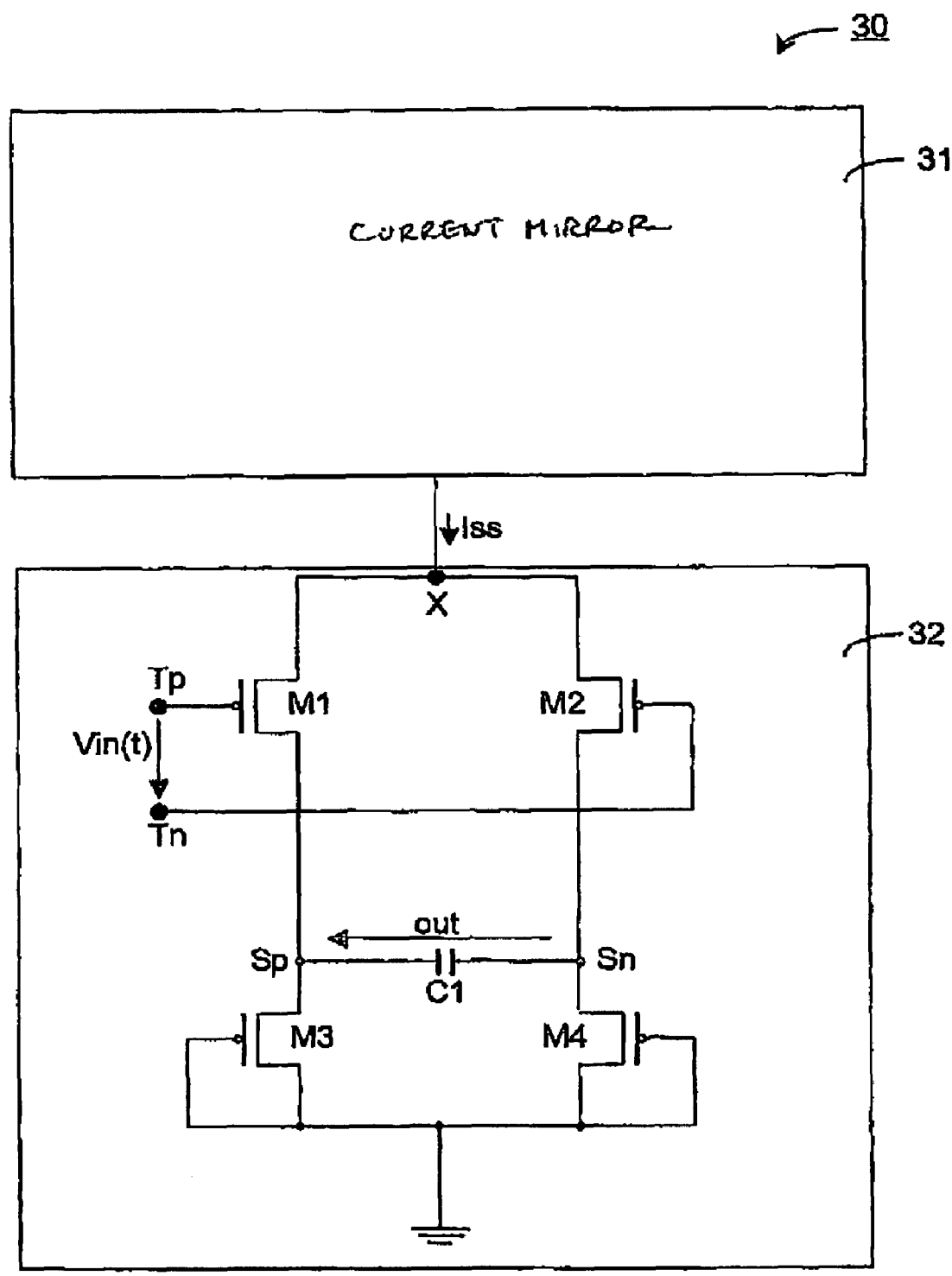
FIG. 5 is a schematic block diagram of a third embodiment, according to the present invention.

In another embodiment, according to the invention, these two load resistors R1 and R2 are replaced by two pMOS transistors M3 and M4 to save area, as illustrated in FIG. 5. This leads to a slight degradation in performance. With two diode-connected pMOS transistors M3 and M4 as load, one obtains the full-MOS sine wave shaper 32 of FIG. 5. The sine wave shaper 32 of FIG. 5 is almost identical to the one depicted in FIG. 4 and reference is thus made to the description of FIG. 4. The tail current $I_{ss}$ is provided by a current mirror 31.

Figure 6:
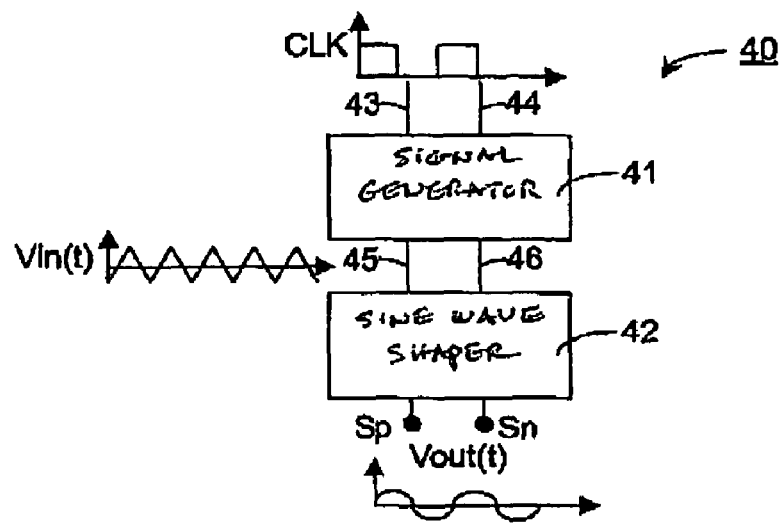
FIG. 6 is a schematic block diagram of a fourth embodiment, according to the present invention.

Yet another embodiment of the invention is addressed in connection with the schematic block diagram in FIG. 6. A circuit 40 is depicted having two major building blocks 41 and 42. The first building block 41 is a square-wave to triangular-wave transformer. A square wave clock signal (CLK) is applied to the inputs 43, 44 of the building block 41. This block 41 generates a triangular signal Vin(t) that is applied to the inputs 45, 46 of a sine wave shaper 42. This sine wave shaper 42 comprises a current mirror, e.g. a regulated current mirror, and a fully differential transistor pair. It is operated in a manner so as to provide a sine wave shaped output signal Vout(t) at an output Sn, Sp. This embodiment 40 allows a sine wave signal to be generated starting with a square wave signal CLK.

Figure 7:
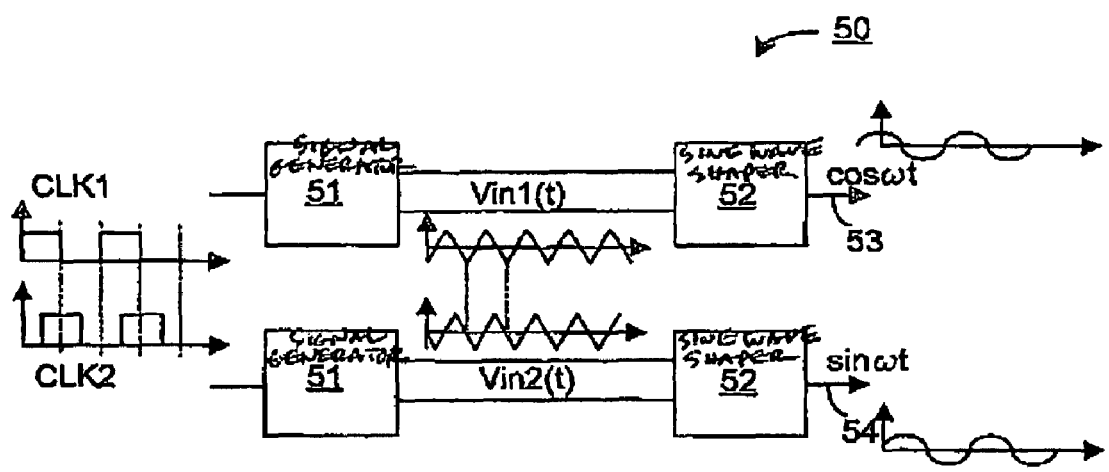
FIG. 7 is a schematic block diagram of a fifth embodiment, according to the present invention.

A further embodiment is illustrated in FIG. 7. In this Figure, a circuit 50 is shown that provide a sine wave output signal and a cosine wave output signal. The circuit 50 has two identical processing path. Each processing path comprises a square-wave to triangular-wave transformer 51 followed by a sine wave shaper 52. The upper processing path receives a square wave CLK1 as input signal. The lower processing path receives a square wave CLK2 as input signal. This square wave CLK2 is phase shifted with respect to the square wave CLK1. The phase difference is $\pi/2$. The square-wave to triangular-wave transformers 51 provide a triangular signals Vin1(t) and Vin2(t) out their output sides. These triangular signals Vin1(t) and Vin2(t) are phase shifted, too. The phase difference still is $\pi/2$. The signals Vin1(t) and Vin2(t) are processed by the sine wave shapers 52. At the output 53 a cosine wave output signal ($\cos \omega t$) is provided.

A sine wave output signal ($\sin \omega t$) is provided at the output 54.

The two most important parameters describing the quality of a sinusoidal wave are the frequency accuracy and the spectrum purity. Because a sine wave shaping is an amplitude-related process of gradual rounding of the triangular input signal $V_{in}(t)$, the input frequency accuracy and stability is preserved after the shaping, and the frequency tuning capability of the input is also retained. Therefore, the attention here is focused only on the purity of the output sine wave Vout, described often by THD. The lower the THD, the closer the output Vout will approach the pure (ideal) sine wave.

It is an advantage of the present invention that a very low THD can be achieved. Depending on the actual embodiment, the THD can be smaller than 0.45%, up to 11th harmonics. As a comparison, the THD of the triangular wave at the input of the shaper is as high as 12%.

The proposed MOS sine wave shaper, according to the present invention, reduces the THD by as much as a factor of 27, or 28.5 dB. It can be demonstrated that the amplitude of the $3^{rd}$ harmonic at 300 kHz is indeed lower than that of the $5^{th}$ harmonic.

Looking at the MOS shaping circuit of FIG. 4 and FIG. 5, and results achieved with such circuits, one may indeed be surprised by the high quality of the shaped sine wave at the output.

Another major merit of the invention is the very low power consumption. The shaper consumes only a few μA current. Depending on the actual implementation, the current consumption may be in the range between 10 μA and 20 μA, for example.

The present invention can be realized using standard elements and there is thus no need for special circuits. One can use p-type as well as n-type transistors. Well suited are CMOS field effect transistors.

It is appreciated that various features of the invention which are, for clarity, described in the context of separate embodiments may also be provided in combination in a single embodiment. Conversely, various features of the invention which are, for brevity, described in the context of a single embodiment may also be provided separately or in any suitable sub combination.

In the drawings and specification there has been set forth preferred embodiments of the invention and, although specific terms are used, the description thus given uses terminology in a generic and descriptive sense only and not for purposes of limitation.

The invention claimed is:

1. Apparatus for generating a sine wave shaped output signal at an output, said apparatus comprising a first transistor and a second transistor being arranged as differential pair having two input nodes, circuitry for producing a triangular input signal with a given amplitude, the triangular input signal being applied between a gate of the first transistor and a gate of the second transistor, said differential pair having a node where a source of the first transistor and a source of the second transistor are connected, the sine wave shaped signal being provided between a drain of the first transistor and a drain of the second transistor, and a current mirror for feeding a predefined tail current into the node of said differential pair, said differential pair being biased to cause the first transistor and the second transistor to be operated in the saturation region such that the sine wave shaped output signal is a nonlinear function of the triangular input signal, wherein a capacitor is situated between the drain of the first transistor and the drain of the second transistor in order to suppress high-order harmonics present in the sine wave shaped output signal.

2. The apparatus of claim 1, wherein the amplitude of the triangular input signal is smaller than a supply voltage, the amplitude preferably being 1.271 Volts.

3. The apparatus of claim 1, wherein the tail current is a DC current.

4. The apparatus of claim 1, wherein the sine wave shaped output signal has a $3^{rd}$ harmonic whose amplitude is smaller than the amplitude of the $5^{th}$ harmonic.

5. The apparatus of claim 1, wherein the first transistors and the second transistor are matched to form a matched differential pair.

6. The apparatus of claim 1, wherein a first load resistor is situated between the drain of the first transistor and supply/ground, and a second load resistor is situated between the drain of the second transistor and supply/ground, in order to convert an output current provided at the drain of the first transistor and the drain of the second transistor, respectively, into an output voltage, said first load resistor being preferably equal to the second load resistor.

7. The apparatus of claim 1, wherein a first diode-connected transistor is situated between the source of the first transistor and ground, and a second diode-connected transistor is situated between the source of the second transistor and ground, in order to convert an output current provided at the source of the first transistor and the source of the second transistor, respectively, into an output voltage.

8. The apparatus of claim 1, wherein the current mirror is a regulated current mirror comprising at least one transistor pair serving a current mirror.

9. The apparatus of claim 8, wherein the current mirror comprises a first current source providing a first bias current and a second current source providing a second bias current.

10. The apparatus of claim 1, wherein the triangular input signal has a frequency that is identical to the frequency of the sine wave shaped output signal.

11. The apparatus of claim 1, wherein tips of the triangular input signal are rounded off.

12. The apparatus of claim 1, wherein the input frequency accuracy and stability is preserved during the shaping.

* * * * *